US006961893B1

(12) United States Patent
Mukund et al.

(10) Patent No.: US 6,961,893 B1
(45) Date of Patent: Nov. 1, 2005

(54) SEPARABLE CYCLIC REDUNDANCY CHECK

(75) Inventors: Shridhar Mukund, San Jose, CA (US); Manish Mahajan, Hyderabad (IN); Vasantha Srirambhatla, Hyderabad (IN); T.V.P. Kameswar Rao, Hyderabad (IN); Anjan Mitra, Sunnyvale, CA (US)

(73) Assignee: Adaptec, Inc., Milpitas, CA (US)

( * ) Notice: Subject to any disclaimer, the term of this patent is extended or adjusted under 35 U.S.C. 154(b) by 368 days.

(21) Appl. No.: 10/113,147

(22) Filed: Mar. 28, 2002

(51) Int. Cl.$^7$ ............................................. H03M 13/00
(52) U.S. Cl. ...................................... 714/781; 714/807
(58) Field of Search ................................ 714/758, 781, 714/776, 746, 757, 807

(56) References Cited

U.S. PATENT DOCUMENTS

| 5,410,546 A | * | 4/1995 | Boyer et al. ................. 714/763 |
| 5,691,997 A | * | 11/1997 | Lackey, Jr. .................. 714/807 |
| 5,694,407 A | | 12/1997 | Glaise |
| 5,754,564 A | | 5/1998 | Francis |
| 5,878,057 A | | 3/1999 | Maa |
| 5,951,707 A | | 9/1999 | Christensen et al. |
| 6,038,694 A | * | 3/2000 | Swallow ...................... 714/781 |
| 6,195,780 B1 | * | 2/2001 | Dravida et al. .............. 714/758 |
| 6,219,815 B1 | | 4/2001 | DesJardins et al. |
| 6,560,742 B1 | * | 5/2003 | Dubey et al. ................ 714/757 |
| 6,681,364 B1 | * | 1/2004 | Calvignac et al. ........... 714/776 |
| 2003/0061561 A1 | * | 3/2003 | Rifaat et al. ................. 714/774 |
| 2003/0167440 A1 | * | 9/2003 | Cavanna et al. ............. 714/781 |

OTHER PUBLICATIONS

International Search Report , Feb. 13, 2003.
IBM Technical Disclosure Bulletin, "Check Character Generating Circuit" , Apr. 1963.
European Search Report.

* cited by examiner

Primary Examiner—Albert Decady
Assistant Examiner—John P. Trimmings
(74) Attorney, Agent, or Firm—Martine Penilla & Gencarella, LLP

(57) ABSTRACT

A method and apparatus for performing a cyclic redundancy check (CRC) process is provided. The CRC is capable of being performed on data received out of order without having to store and assemble the data. One exemplary method for computing a CRC for a transmitted data stream initiates with performing a CRC process on a first segment of the data stream to generate a first CRC remainder. Next, the first CRC remainder for the first segment is projected. Then, the CRC process on a second segment of the data stream is performed to generate a second CRC remainder. Next, the second CRC remainder for the second segment is projected. Then, the projected remainders are combined to calculate a complete CRC remainder for the data stream in an order independent fashion. Data streams including multiple segments can be handled by the CRC process.

20 Claims, 9 Drawing Sheets

SEPARABLE CYCLIC REDUNDANCY CHECK

BACKGROUND OF THE INVENTION

1. Field of the Invention

This invention relates generally to methods and apparatus for performing a cyclic redundancy check (CRC) and more particularly to a method and apparatus for performing a CRC process on data that is received out of order without having to store and assemble the data in order to perform the CRC.

2. Description of the Related Art

Digital data transmission systems are used in a variety of different applications touching all aspects of a person's daily activities. These systems range from transferring money through bank accounts to storing the music on compact digital audio discs. It is imperative to be able to check whether the transmitted data is received without errors. More particularly, without the capability to check if transmitted data is received without errors, the transfer of funds electronically would be an unacceptably high risk. Thus, there would be severe consequences for the world financial system without error detection capability.

One method for error detection is the cyclic redundancy check (CRC) method. A transmitting device calculates a CRC for a message to be transmitted. The CRC, which is a sequence of bits, is appended to the message being transmitted. On the receiving end, a CRC is recalculated by the receiving device and this CRC is compared to the received CRC to determine if an error has occurred. FIG. 1 is a diagram depicting the prior art execution of a CRC method. Data stream 102, which consists of words A–H, is being received by a device. CRC 104 is appended to the end of data stream 102 by the transmitting device. The receiving device performs the CRC in sequential order of a data stream. As illustrated in FIG. 1, a CRC is performed one word at a time in sequential order. Therefore, a CRC is performed on word A, then the result is combined with word B and a CRC is performed with the result then being combined with word C and so on. After completion of word H, a remainder is inverted and appended to the end of data stream 102 as represented by CRC 104. As is well known, the Ethernet CRC algorithm performs the steps described above with respect to FIG. 1.

FIG. 2 represents a prior art diagram of the sequential processing nature of a CRC method for data stream 102. Data stream 102 is processed sequentially by CRC engine 106 where each word of data steam 102 is processed to obtain CRC remainder 108. CRC remainder 108 for each word or packet is then combined with the next word or packet in sequential order. This process is repeated until the end of data stream 102 is reached as described with respect to FIG. 1. At the completion of the process a remainder is inverted by inverter 107 to provide a complete CRC 109 which is appended to the end of data stream 102.

With respect to the prior art, data stream 102 must be processed sequentially. However, when large data streams are sent over a channel they are split into small-sized segments during transmission. This is especially true with distributed networks over a wide area such as the Internet where packets or cells of data can be sent by different routes, thus these packets may be received at the destination out of sequential order. Consequently, the small-sized segments, i.e., packets or cells, must be stored in local memory where it can be reassembled in the original sequential order once the complete data stream is received. Once the data stream is assembled in order then the CRC is performed. Moreover, with the accelerating adoption of Internet Small Computer System Interface (iSCSI), a storage networking standard for linking data storage facilities, which transmits protocol data units (PDU) made up of separate packets, the delays may become longer depending on the amount of data being transmitted and at the same time the memory capacity will need to be increased to handle the large amounts of data transmitted. Thus, a longer delay is incurred while waiting for the entire data stream to be received and more of the capacity of the local memory is being consumed to store the data stream.

In view of the foregoing, there is a need to perform CRC on segments or packets of a data stream without having to assemble the data stream in its original sequential order.

SUMMARY OF THE INVENTION

Broadly speaking, the present invention fills these needs by providing a method and apparatus to perform a separable CRC on the individual packets of a data stream and combine the separable CRC's without having to receive the complete data stream. It should be appreciated that the present invention can be implemented in numerous ways, including as a process, an apparatus, a system, or a device. Several inventive embodiments of the present invention are described below.

In one embodiment, a method for computing a cyclic redundancy check (CRC) for a transmitted data stream is provided. The method initiates with performing a CRC process on a first segment of the data stream. The CRC process generates a first CRC remainder. Next, the first CRC remainder for the first segment is projected. Then, the CRC process on a second segment of the data stream is performed. The CRC process generates a second CRC remainder. Next, the second CRC remainder for the second segment is projected. Then, the projected first CRC remainder and the projected second CRC remainder are combined to calculate a complete CRC remainder for the data stream.

In another embodiment, a method for performing a cyclic redundancy check (CRC) for a transmitted data stream having at least two segments is provided. The method initiates with receiving the data stream and then identifying whether the at least two segments are in sequential order. For each of the at least two segments in sequential order, a CRC process is performed on the at least two segments in sequential order. The CRC process generates a combined remainder for the at least two segments in sequential order. Next, the combined remainder for the at least two segments in sequential order is projected. For each of the segments not in sequential order, the CRC process is performed on each of the segments not in sequential order. Here, the CRC process generates a remainder for each of the segments not in sequential order. Then the remainder for each of the segments not in sequential order is projected. Next, the projected combined remainder for the at least two segments in sequential order and the projected remainders for each of the segments not in sequential order are combined to calculate a complete CRC remainder for the data stream.

In yet another embodiment, a method for computing a cyclic redundancy check (CRC) for a transmitted data stream is provided. The method initiates with performing a CRC process on a first segment of the data stream. The CRC process generates a first CRC remainder. Then, the first CRC remainder for the first segment is projected. Next, the CRC process is performed on a second segment of the data stream. The CRC process generates a second CRC remainder. Then, the second CRC remainder for the second segment is projected. Next, a bit-wise exclusive-OR operation is performed to combine the projected first CRC remainder and the projected second CRC remainder to calculate a complete CRC remainder for the data stream.

In still another embodiment, a computer readable media having program instructions for computing a cyclic redundancy check (CRC) for a transmitted data stream is provided. The computer readable media includes program instructions for performing a CRC process on a first segment of the data stream. Here, the CRC process generates a first CRC remainder. Program instructions for projecting the first CRC remainder for the first segment are included. Program instructions for performing the CRC process on a second segment of the data stream are included. Here, the CRC process generates a second CRC remainder. Program instructions for projecting the second CRC remainder for the second segment and program instructions for combining the projected first CRC remainder and the projected second CRC remainder to calculate a complete CRC remainder for the data stream are included.

In another embodiment, a communication chip adapted to receive a data stream transmitted in segments and perform a cyclic redundancy check (CRC) on the segments of the data stream without having received an entirety of the data stream is provided. The communication chip includes a physical layer configured to communicate with a transmitting device over a network and a receiving section configured to receive the segments of the data stream. Also included is a processing section having circuitry for performing a CRC process on a first segment of the data stream, where the CRC process generates a first CRC remainder. The processing section has circuitry for projecting the first CRC remainder for the first segment and circuitry for performing the CRC process on a second segment of the data stream, where the CRC process generates a second CRC remainder. Also included in the processing section of the communication chip is circuitry for projecting the second CRC remainder for the second segment and circuitry for combining the projected first CRC remainder and the projected second CRC remainder to calculate a complete CRC remainder for the data stream.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for an apparatus and method for computing a cyclic redundancy check (CRC) for segments of a data stream received in non-sequential order. It will be obvious, however, to one skilled in the art, that the present invention may be practiced without some or all of these specific details. In other instances, well known process operations have not been described in detail in order not to unnecessarily obscure the present invention.

The embodiments of the present invention provide a method and apparatus for computing the CRC of an original data stream where the CRC is calculated from partial results computed from segments received in non-sequential order. The CRC is computed without the need to assemble the segments in their original order. Thus, the storage of the individual segments is not necessary as the CRC is computed on the fly. Data streams are made up of a number of segments, e.g., packets or cells, which can be individually transmitted to a receiving destination. For example, packets of data making up a protocol data unit (PDU) may travel different routes to a destination, especially when the PDU is transmitted over the Internet. Some of the transmitted segments can be received in sequential order while other segments are not received in sequential order. In one embodiment, a projected CRC is determined for each of the group or groups of segments received in sequential order while another projected CRC is determined for each of the segments received in non-sequential order. As will be explained in more detail below, the projected CRC values are determined by mathematically moving a calculated CRC for each segment or groups of segments. Once all the segments have been processed, the projected CRC values are combined to determine a complete CRC for the data stream. As one skilled in the art will appreciate, the CRC for the data stream is inverted and then compared to a CRC from the transmitted data stream to determine if the data stream has been received without errors.

Figure 1:
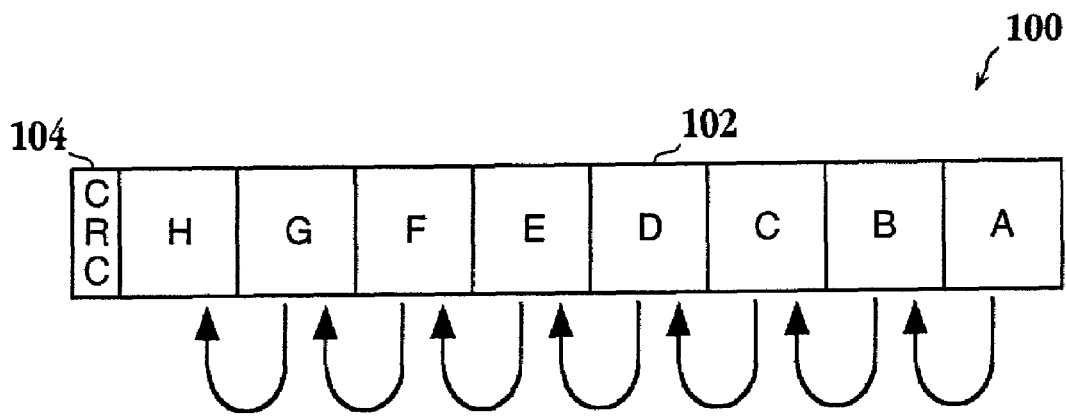
FIG. 1 is a diagram depicting the prior art execution of a CRC method.
Figure 2:
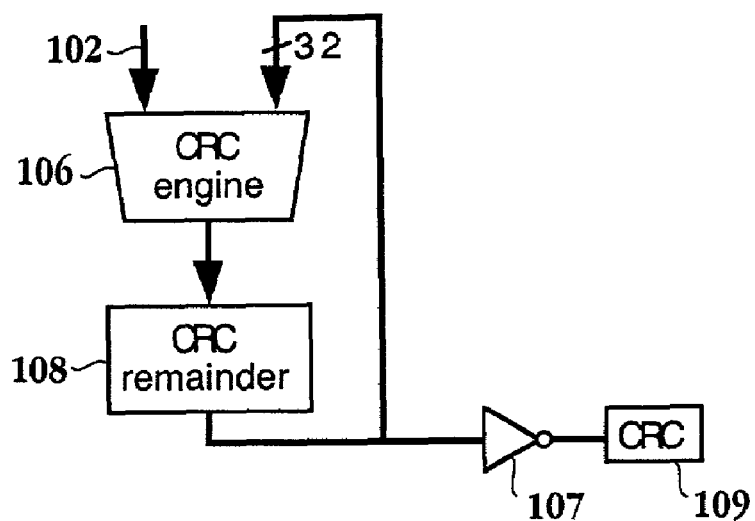
FIG. 2 represents a prior art diagram of the sequential processing nature of a CRC method for a data stream.
Figure 3:
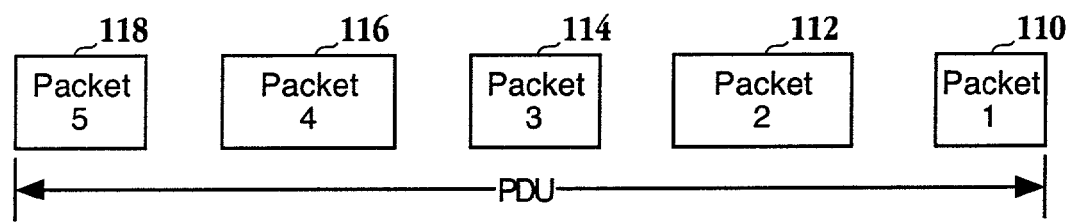
FIG. 3 is a diagram of a protocol data unit (PDU) transmitted in sequential order in accordance with one embodiment of the invention.

FIG. 3 is a diagram of a protocol data unit (PDU) transmitted in sequential order in accordance with one embodiment of the invention. The PDU of FIG. 3 consists of packet 1 110, packet 2 112, packet 3 114, packet 4 116 and packet 5 118. In one embodiment, packets 1–5 are of varying size in addition to the PDU consisting of varying amounts of packets. One skilled in the art will appreciate that in addition to the CRC of the present invention, an Ethernet CRC may also be performed on the individual packets. It should be appreciated that the Ethernet CRC is a separate CRC computation than the embodiments of the present invention. Additionally, it should be appreciated that while the Figures herein refer to the segments as being packets, this is not meant to be limiting as the separable CRC process can be applied to any segments of a data stream such as packets, cells, and the like.

Figure 4:
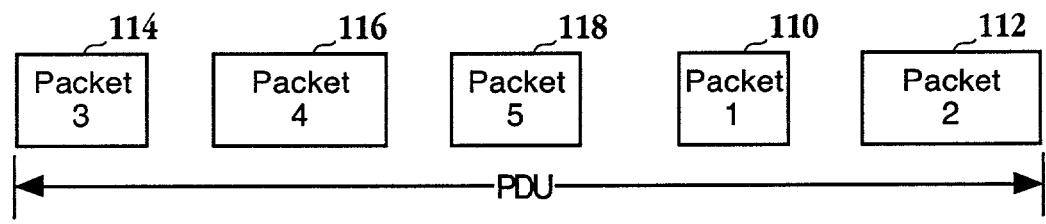
FIG. 4 is a diagram of a PDU received in a non-sequential order in accordance with one embodiment of the invention.

FIG. 4 is a diagram of a PDU received in a non-sequential order in accordance with one embodiment of the invention. Here, the non-sequential order that the transmitted packets are received is shown as packet 2 112, packet 1 110, packet 5 118, packet 4 116 and packet 3 114. It will be apparent to one skilled in the art that the packets can be received in any order and that FIG. 4 is illustrative of one order for exemplary purposes. Furthermore, where the packets are transmitted through the Internet to a receiving device, there can be a significant delay in the receipt of one or more of the packets of the PDU depending on the data path for the packet between the origin and the destination. For example, packet 2 112, packet 1 110, packet 5 118 and packet 4 116 may be received in a relatively short time frame, but packet 3 114 may take significantly longer to arrive at the receiving device. Therefore, by performing the CRC as a separable process, significant advantages are realized with respect to processing time as well as memory capacity required as will be explained below. Of course, the PDU can be associated with an Internet protocol (IP) standard such as Internet small computer system interface (iSCSI), fibre channel over IP (FCIP), Common Internet file system (CIFS), direct access file system (DAFS), etc., or any other standard for routing data between an origin and a destination over a packet-switched network.

Figure 5:
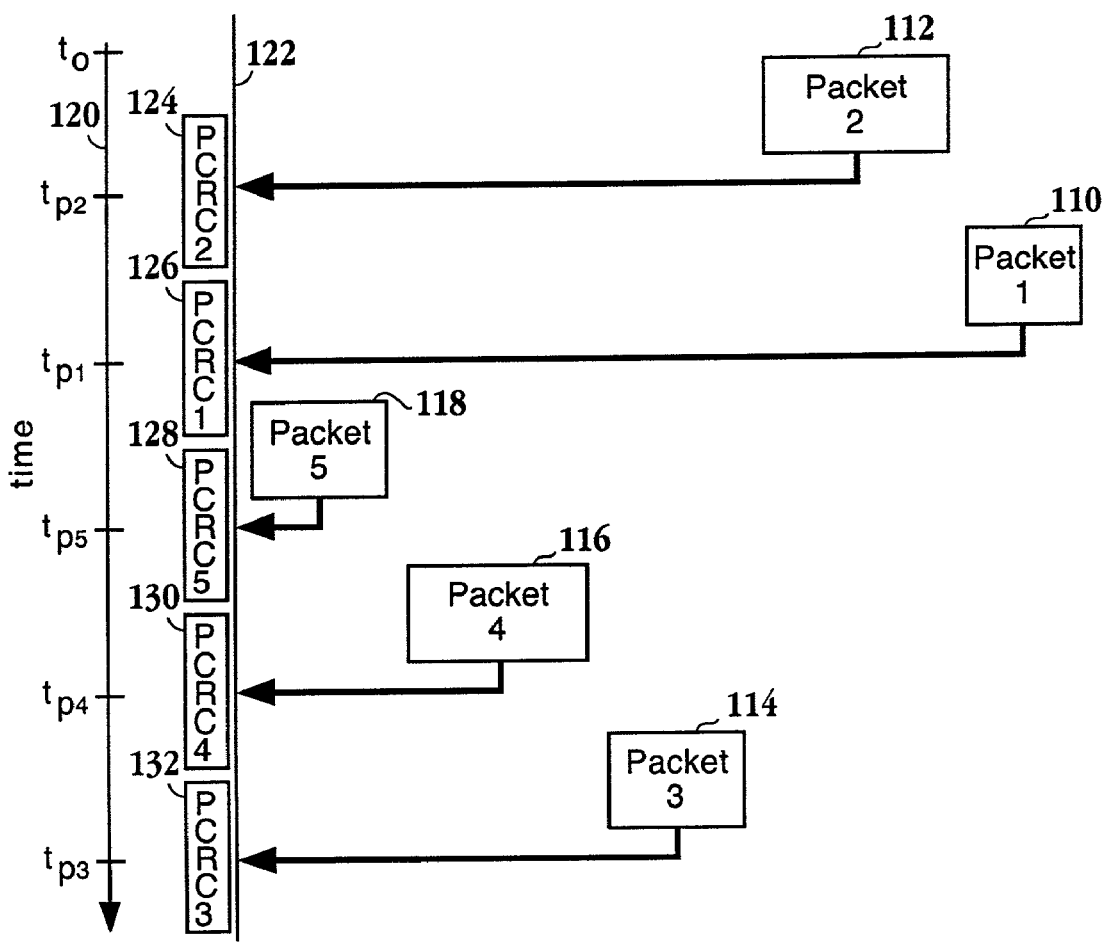
FIG. 5 is a schematic diagram of a CRC process being performed on the packets received in the non-sequential order as shown in FIG. 4 to determine a projected CRC remainder for each of the packets in accordance with one embodiment of the invention.

FIG. 5 is a schematic diagram of a CRC process being performed on the packets received in the non-sequential order as shown in FIG. 4 to determine a projected CRC remainder for each of the packets in accordance with one embodiment of the invention. The left hand axis 120 provides a timeline as to when certain activities take place. Upon initiation at time 0 ($t_0$), packet 2 112 is received and a CRC process is performed on packet 2. It will be apparent to one skilled in the art that the CRC process performed on packet 2 112 will result in a remainder being determined. The determined remainder is then projected to the end of the PDU of FIG. 4. That is, the determined remainder is mathematically moved to the end of the PDU, which is represented by line 122 of FIG. 5. It should be appreciated that the mathematical movement of the determined remainder can also be referred to as projecting the CRC from packet 2 112. Accordingly, the projected CRC (PCRC2) 124 of packet 2 112 is determined at time $t_{p2}$. In other words, PCRC2 124 is a remainder computed from the CRC process performed on packet 2 112 that is projected to the end of the PDU. Similarly, a CRC process is performed on packet 1 110, which is received after packet 2 112. The CRC process on packet 1 110 yields a remainder from which a projected CRC (PCRC1) 126 of packet 1 is determined at time $t_{p1}$. One skilled in the art will appreciate that the receiving device is capable of determining the order in which the packets are received, since the packets contain their respective location or order number in the header information of each packet. For example, with respect to an iSCSI PDU, it can be easily determined where a segment is positioned within the PDU sequence from the iSCSI header and transmission control protocol (TCP) sequence number.

Still referring to FIG. 5, packet 5 118 is received next. A CRC process is performed on packet 5 118 where a remainder is determined from which a projected CRC (PCRC5) 128 is calculated for packet 5 at time $t_{p5}$. In a likewise fashion for the next received packet, packet 4 116, a projected CRC (PCRC4) 130 is computed at time $t_{p4}$. Packet 3 114 is then received and a projected CRC (PCRC3) 132 is determined at time $t_{p3}$ from the remainder of the CRC process performed on packet 3. It should be appreciated that by performing a CRC process on each packet as it is received eliminates the need for storing each of the packets until all the packets are received in order to assemble the packets in sequential order. That is, the CRC process is performed on the fly. The mathematical formulae used to project the CRC remainder are discussed in more detail below.

Figure 6:
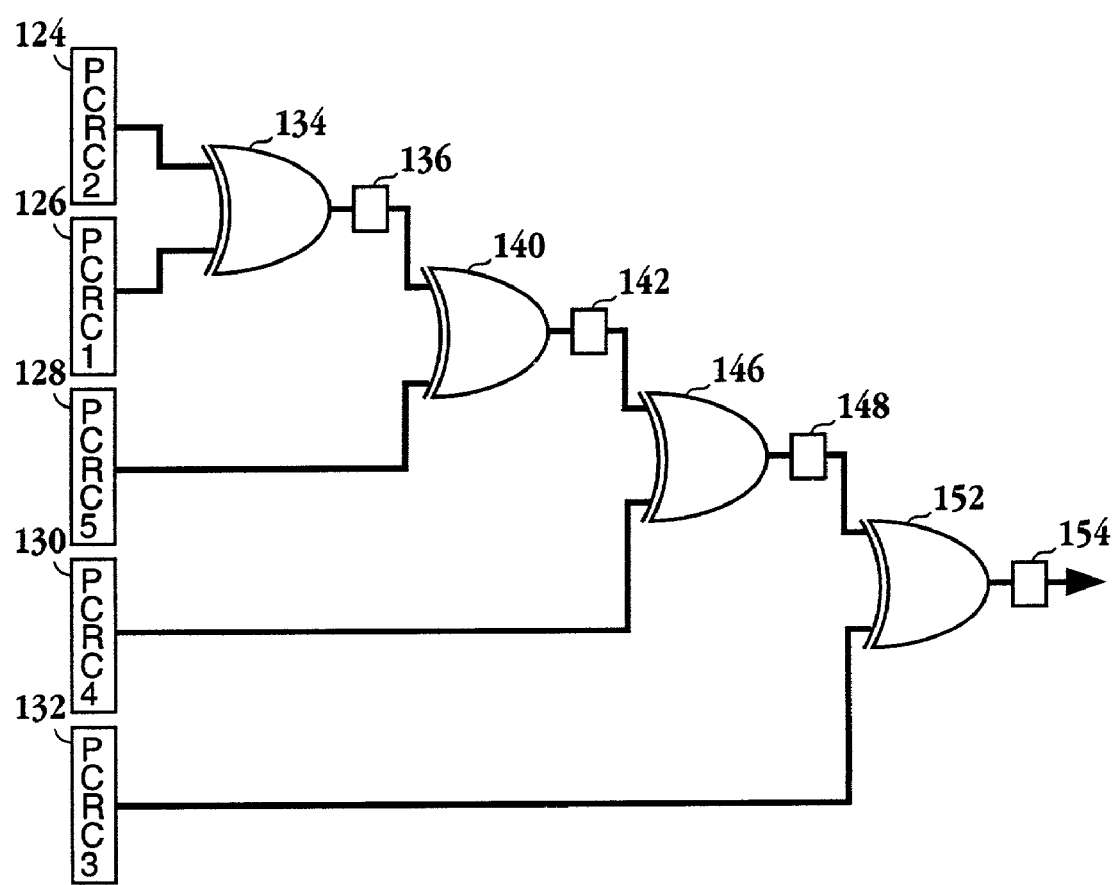
FIG. 6 is a schematic diagram for performing a bit-wise exclusive-OR (XOR) operation on the projected CRCs of FIG. 5 to determine a complete CRC remainder for the PDU of FIG. 4 in accordance with one embodiment of the invention.

FIG. 6 is a schematic diagram for performing a bit-wise exclusive-OR (XOR) operation on the projected CRCs of FIG. 5 to determine a complete CRC remainder for the PDU of FIG. 4 in accordance with one embodiment of the invention. Here, PCRC2 124 and PCRC1 126, which are computed first and second, respectively, serve as inputs to a bit-wise XOR logic gate 134. Logic gate 134 produces an intermediate CRC 136 from PCRC2 124 and PCRC1 126 inputs. Intermediate CRC 136 is then used as an input along with PCRC5 128 for bit-wise XOR logic gate 140. As mentioned above, there may be some time delay between the receipt of the packets of the PDU by the receiving device, therefore, with a hardware implementation, timing circuitry of a clock functions ensures the availability of PCRC5 128 in accordance with one embodiment of the invention. Logic gate 140 outputs intermediate CRC 142, which correlates to the combination of PCRC2 124, PCRC1 126 and PCRC5 128.

Still referring to FIG. 6, intermediate CRC 142 is then combined with PCRC4 130 through a bit-wise XOR operation performed by logic gate 146 to yield intermediate CRC 148. As mentioned above in a hardware implementation a clock serves to ensure PCRC4 130 is available prior to intermediate CRC 142 being input to logic gate 146. In a likewise fashion, intermediate CRC value 148 is combined with PCRC3 132, through a bit-wise XOR operation performed by logic gate 152. As the PDU for FIGS. 4–6 is made up of packets 1–5, the output of XOR logic gate 152 is the complete CRC 154. Thus, by projecting CRC remainders for each packet irrespective of the order in which they are received, and then combining each of the projected CRC remainders through bit-wise XOR operations, a complete CRC remainder is determined on the fly. Thus, the need to store the packets in memory until all the packets are received is eliminated, which in turn frees up or eliminates memory designated for storing the packets. It should be appreciated that the process described above with respect to FIG. 6 may be implemented through hardware or software. In an embodiment implemented through hardware, each intermediate CRC value is placed in staging circuitry, such as storage circuits, i.e., latches, flip flops, etc.

Figure 7:
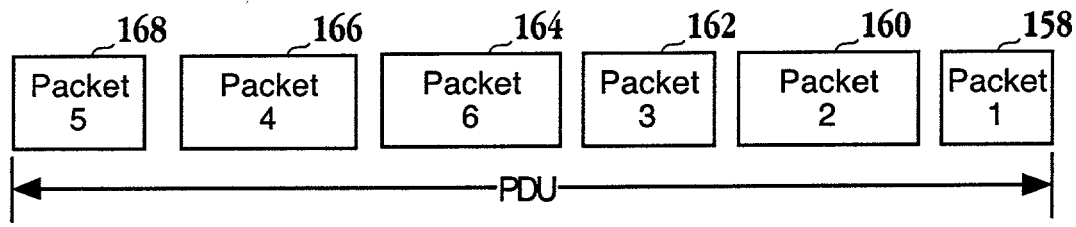
FIG. 7 is a diagram of a PDU where some segments are received in a sequential order and other segments are received in a non-sequential order in accordance with one embodiment of the invention.

FIG. 7 is a diagram of a PDU where some segments are received in a sequential order and other segments are received in a non-sequential order in accordance with one embodiment of the invention. As shown in FIG. 7, packets 1 158, packet 2 160 and packet 3 162 are received in sequential order. Packet 6 164, packet 4 166 and packet 5 168 are received in non-sequential order. It should be appreciated that FIG. 7 is being shown for exemplary purposes and not meant to be limiting as any number of packets can be included in the PDU.

Figure 8:
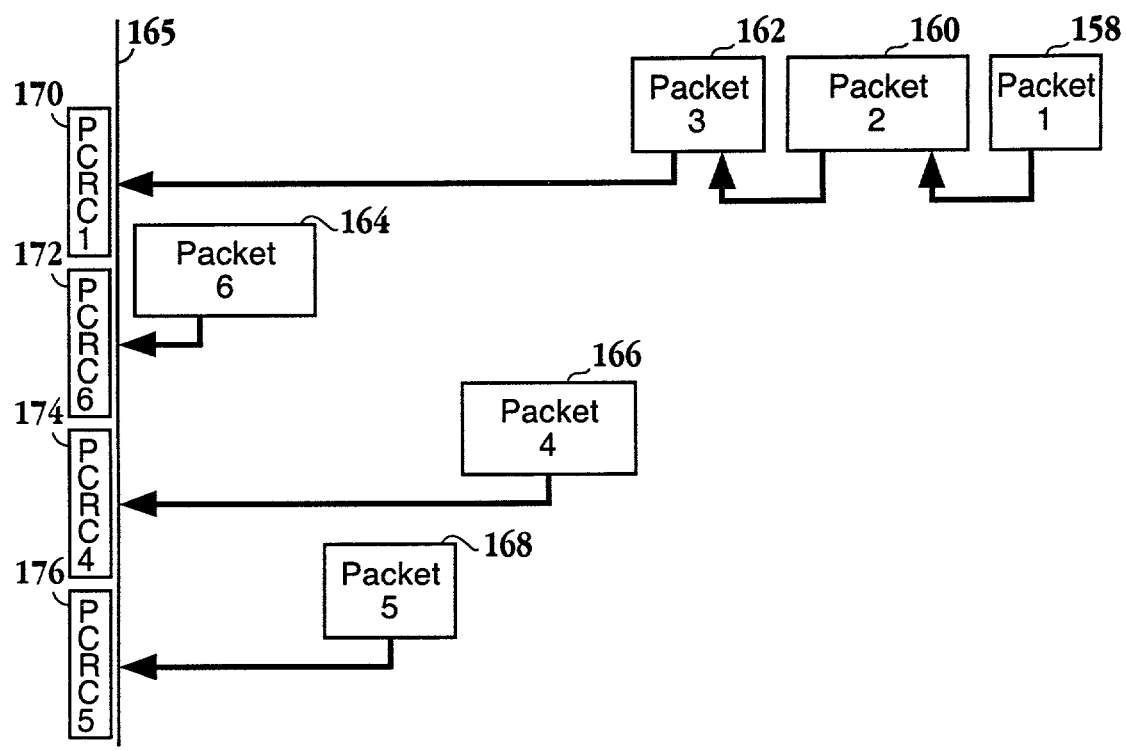
FIG. 8 is a schematic diagram of a CRC process being performed on the packets received in the sequential and non-sequential order as shown in FIG. 7 to determine a projected CRC remainder for each of the packets in accordance with one embodiment of the invention.

FIG. 8 is a schematic diagram of a CRC process being performed on the packets received in the sequential and non-sequential order as shown in FIG. 7 to determine a projected CRC remainder for each of the packets in accordance with one embodiment of the invention. Packets 1, 2, and 3, 158, 160, and 162, are received in sequential order. Therefore, a conventional CRC process is performed on packet 1 158 and the result is combined with a CRC performed on packet 2 160. The resulting CRC remainder from packets 1 and 2 is then combined with a CRC performed on packet 3 162 to yield a CRC remainder for packets 1–3. This CRC remainder for packets 1–3 is then projected to yield projected CRC (PCRC1) 170. As mentioned above with reference to FIG. 5, the PCRC1 is mathematically moved to the end of the PDU represented by line 164. In addition, the sequential segments can be identified by the transmission control protocol (TCP) sequence number in the packet header. Calculated CRC remainders for packet 6 164, packet 4 166 and packet 5 168, which are received in a non-sequential order, are similarly projected to the end of PDU 164. Thus, PCRC6 172 is the projected CRC remainder for packet 6, while PCRC4 174 and PCRC5 176 are the projected CRC remainders for packet 4 166 and packet 5 168, respectively.

Figure 9:
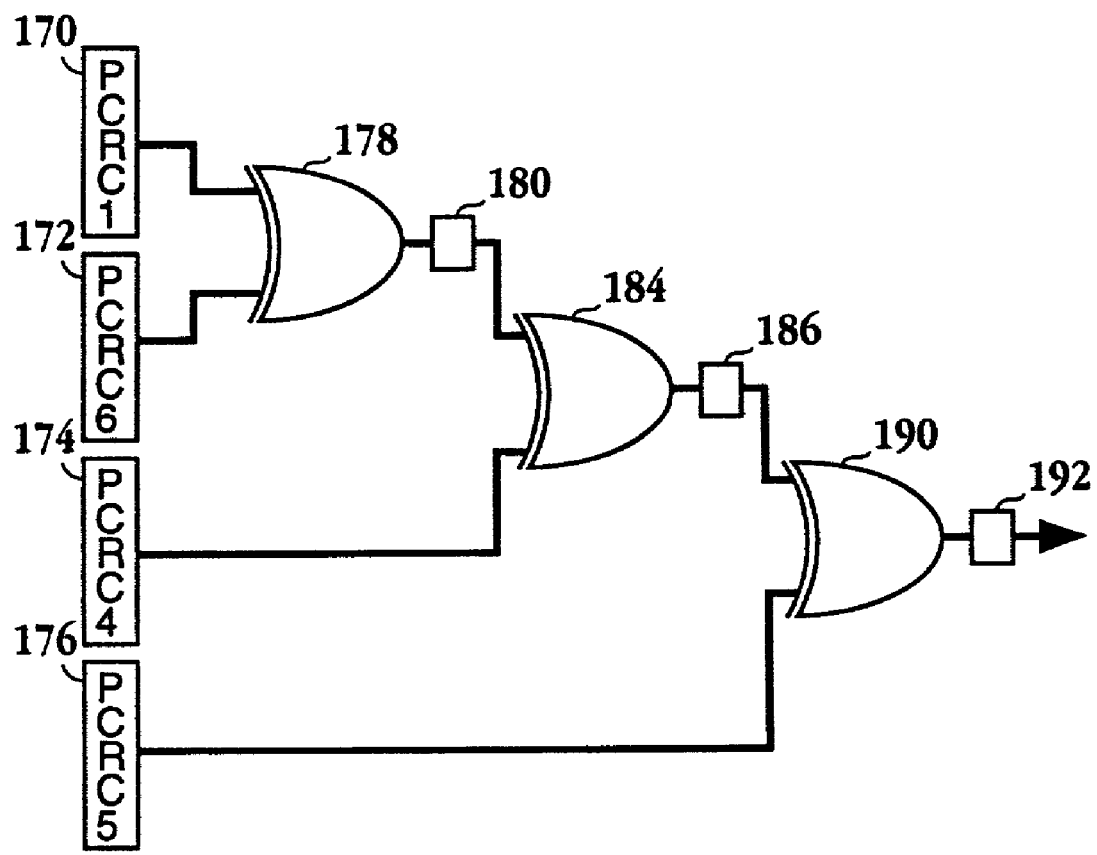
FIG. 9 is a schematic diagram for performing a bit-wise exclusive-OR (XOR) operation on the projected CRCs of FIG. 8 to determine a complete CRC remainder for the PDU of FIG. 7 in accordance with one embodiment of the invention.

FIG. 9 is a schematic diagram for performing a bit-wise exclusive-OR (XOR) operation on the projected CRCs of FIG. 8 to determine a complete CRC remainder for the PDU of FIG. 7 in accordance with one embodiment of the invention. PCRC1 170 and PCRC6 172 are combined through a bit-wise XOR operation performed by logic gate 178. The intermediate CRC 180 is then combined with PCRC4 174 in another bit-wise XOR operation performed by logic gate 184 to compute intermediate CRC 186. For a hardware implementation, one skilled in the art will appreciate that a clock is used to ensures that PCRC4 174 is available to be combined with intermediate CRC 180. Similarly, intermediate CRC 186 is combined with PCRC5 176 through exclusive-OR logic gate 190, resulting in complete CRC remainder 192 for the PDU of FIG. 7. One skilled in the art will appreciate that the complete CRC remainder 192 is inverted and then compared with the CRC from the transmitting device to determine if any errors occurred during transmission. It should be appreciated that the process described above with respect to FIG. 9 may be implemented through hardware or software. In an embodiment implemented through hardware, each intermediate CRC value is placed in staging circuitry, such as storage circuits, i.e., latches, flip flops, etc.

It will be apparent to one skilled in the art that the logic gates of FIGS. 6 and 9 are made up of transistors that may be modified within a transistor layout. Accordingly, any suitable combination of transistors which accomplish the functional computation of the CRC remainder as described herein, will suffice. Additionally, the time for determining the complete CRC remainder is dependent on the number of gates provided. That is, the more gates that are provided the quicker the CRC will be determined. Alternatively, fewer gates will reduce the size of the semiconductor chip necessary to execute the computations described herein. At the same time, the fewer number of gates may also provide an acceptable timeframe for executing the computations. Of course, one skilled in the art will appreciate that the embodiments described herein may also be implemented through software.

The formula which allows the projection of the CRC remainders as discussed with reference to FIGS. 5, 6, 8 and 9 is as follows:

$$R(M_k) = R(mr_{kr} + \ldots + x^{k3+\ldots+kr}m2_{k2} + x^{k2+\ldots+kr} \cdot m1_{k1} + x^{k1+\ldots+kr} \cdot m0_{k0})$$

$$= R(mr_{kr}) + \ldots + R(x^{k3+\ldots+kr}) \cdot R(m2_{k2}) + R(x^{k2+\ldots+kr}) \cdot R(m1_{k1}) +$$

$$R(x^{k1+\ldots+kr}) \cdot R(m0_{k0})$$

where R is the remainder of a message (M) which is k bits wide. It will be apparent to one skilled in the art the $mr_{kr}$, $m2_{k2}$, $m1_{k1}$ and $m0_{k0}$ represent packets of message M, while $R(mr_{kr})$, $R(m2_{k2})$, $R(m1_{k1})$ and $R(m0_{k0})$ represent the CRC remainders of the respective packets. The projected values for each of the CRC remainders is determined by multiplying each CRC remainder by a projection multiplier. In the above equation, $R(x^{k3+\cdots+kr})$, $R(x^{k2+\cdots+kr})$ and $R(x^{k1+\cdots+kr})$ represent the projection multiplier where (k3+ . . . +kr), (k2+ . . . +kr) and (k1+ . . . +kr) represent the distance between each respective packet and the end of the PDU. More particularly, k1 is the length of packet 1, k2 is the length of packet 2, k3 is the length of packet 3 and so on. Accordingly, the product of each of the CRC remainders and each of the respective packets or segments and the respective projection multiplier yields a projected CRC remainder as discussed with reference to FIGS. 5 and 8. Thus, the formula allows for the mathematical movement of the CRC remainders to the end of the PDU. Furthermore, the addition of the projected CRC remainders represent the bit-wise exclusive-OR of the projected CRC remainders as discussed with reference to FIGS. 6 and 9. One skilled in the art will appreciate that the remainder of the initial message vector can be computed from the partial remainders of its component vectors e.g., segments or packets, in an order independent fashion.

In one embodiment, the computation of the projection function times the CRC remainders can be computed fastest when there is no limit on the number of gates to perform the mathematic operations described herein. For example, where $X^t$ represents the projection multiplier and $m_q$ represents the CRC remainder, the product of $x^t$ and $m_q$ can be computed in $\log_2(t)$ multiplications.

Additionally, the computation of the product of $x^t$ and $m_q$ can be done more efficiently by including a Galois field shift (gf_shift) instruction. The gf_shift instruction has the form of:

$$y = x^{a\_power(2,b)} \cdot C$$

The above expression may be calculated in one of several ways as will be apparent to one skilled in the art. For example, the number of steps to achieve the above exponentiation can be accomplished in logarithmic steps. Any method for calculating the above expression can be used to achieve the desired result here.

Figure 10:
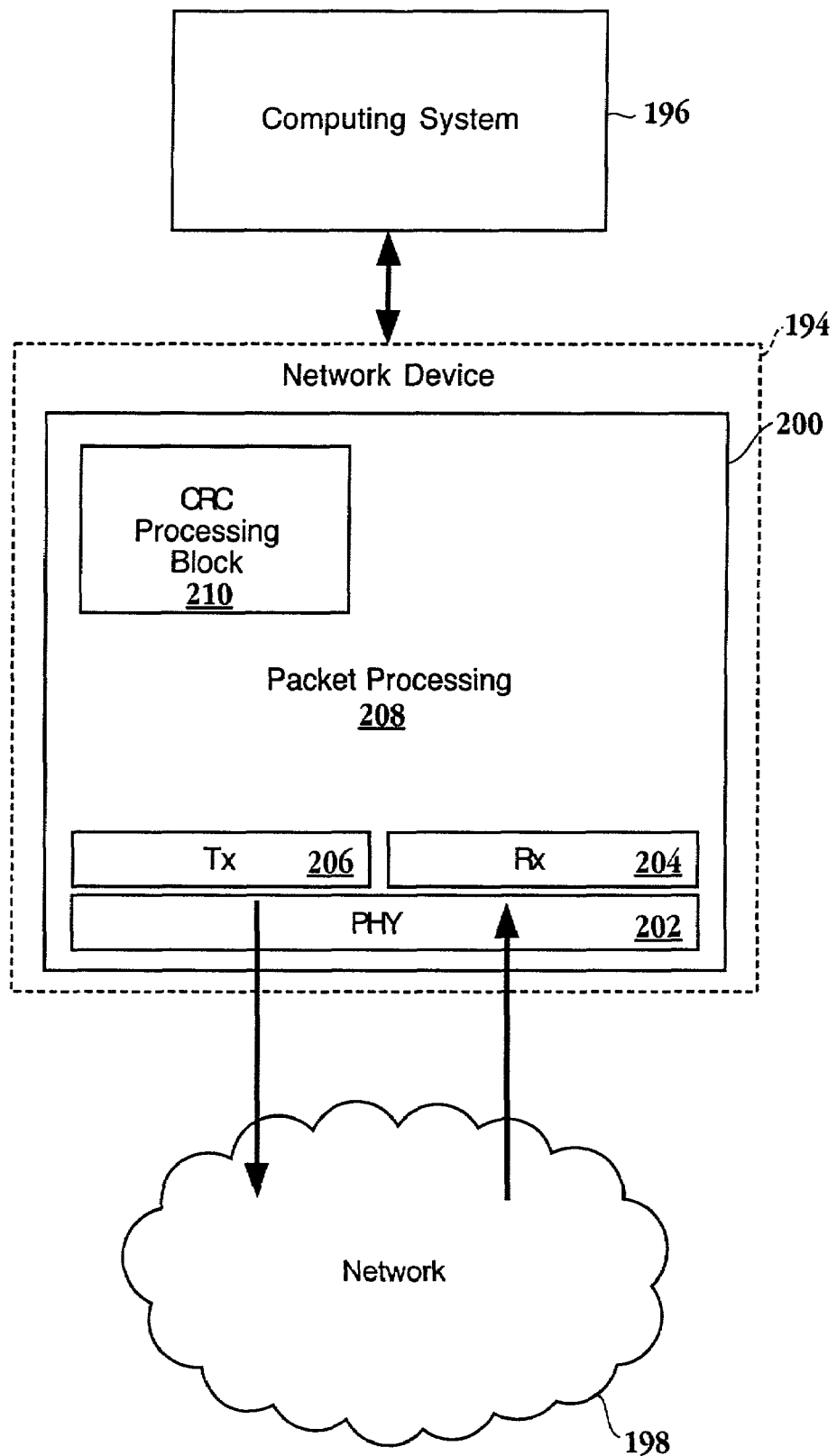
FIG. 10 is a schematic diagram of a communication chip for a networking device having circuitry for performing a separable CRC in accordance with one embodiment of the invention.

FIG. 10 is a schematic diagram of a communication chip for a networking device having circuitry for performing a separable CRC in accordance with one embodiment of the invention. Networking device 194, e.g., a network interface card (NIC) is in communication with computing system 196 and network 198. It should be appreciated that computing system 196 may be a server, workstation, network attached storage (NAS) device, storage area network (SAN), etc. Network 198 includes local area networks (LAN), metropolitan area networks (MAN), wide area networks (WAN) and of course the Internet. Networking device 194 includes communication chip 200. Physical layer 202 supports the interface between communication chip 200 and network 198. Receiving section 204 receives data sent over network 198 to networking device 194 while transmitting section 206 transmits data from the networking device to the network.

Still referring to FIG. 10, packet processing logic section 208 includes logic for processing packets received by networking device 194 in one embodiment. As is well known in the art, packets sent over a network contain data fields in a frame. The frame includes data fields which contain information as to the order of the packet in the transmitted data stream. For example, if five packets make up a data stream, then the TCP sequence number will specify if the respective packet is the first, second, etc., packet. Thus, packet processing logic section 208 includes logic for determining the placement in the original order for each received packet. Accordingly, the distance between each packet and the end of the PDU, as well as the length of the packet, is available for the above described formula. CRC processing block 210 includes logic for determining a CRC remainder. Here, circuitry for projecting a CRC value and circuitry for combining the projected CRC values, as discussed with reference to FIGS. 5, 6, 8 and 9, are included. Thus, the data made available by packet processing logic 208 is manipulated by CRC processing block 210 to arrive at a CRC remainder. In one embodiment, the formulae described above are executed by CRC processing block 210.

Figure 11:
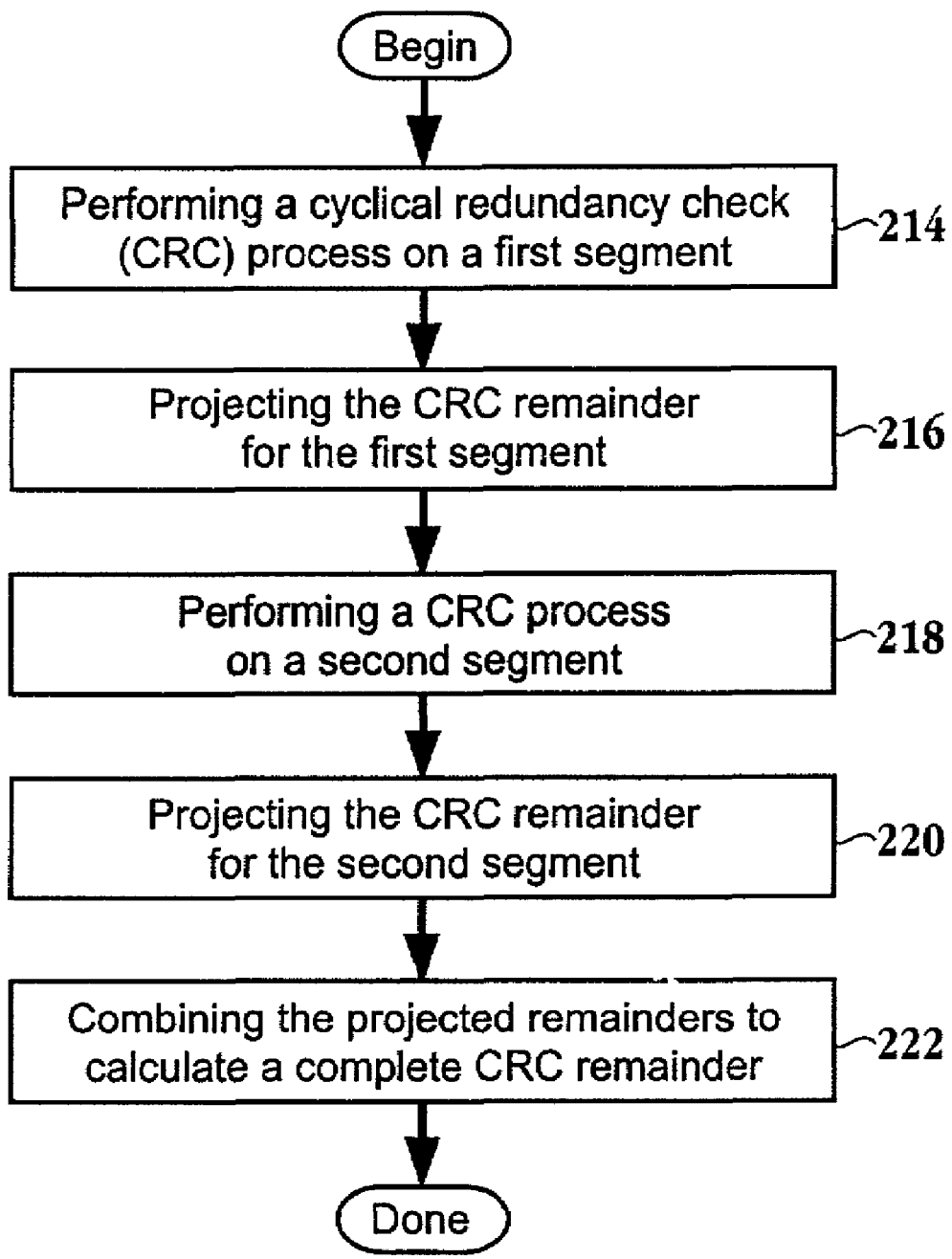
FIG. 11 is a flowchart diagram illustrating the method operations executed when performing a cyclic redundancy check (CRC) for a transmitted data stream in accordance with one embodiment of the invention.

FIG. 11 is a flowchart diagram illustrating the method operations executed when performing a cyclic redundancy check (CRC) for a transmitted data stream in accordance with one embodiment of the invention. The method begins in operation 214 where a CRC process is performed on a first segment, e.g., packet. As described above with reference to FIGS. 4–6, when segments of a transmitted data stream are not received in sequential order, a CRC process is performed on a received segment without waiting for the entire data stream to be received. Thus, a remainder for the first received segment is generated upon its receipt by the receiving device. The method then advances to operation 216 where the remainder from the CRC process of operation 214 is projected. Again with reference to FIGS. 4–6, and the formula described above for projecting a CRC remainder, a projected CRC remainder is computed by mathematically moving the CRC remainder to the end of the PDU. Moving to operation 218, a CRC process is performed on a second segment. It should be appreciated that the second segment is not in sequential order with the first segment. The method proceeds to operation 220 where the CRC remainder for the second segment is projected. One skilled in the art will appreciate that by processing the CRC on the fly eliminates the need for storing the segments and reassembling the segments in correct sequential order prior to performing the CRC. Thus, there is no need for large memory capacity to store the received segments prior to performing the CRC. The method advances to operation 222 where the projected remainders for the first and second segments are combined to calculate a complete CRC remainder. In one embodiment, the projected remainders from operations 216 and 220 are combined through a bit-wise exclusive-OR operation.

Figure 12:
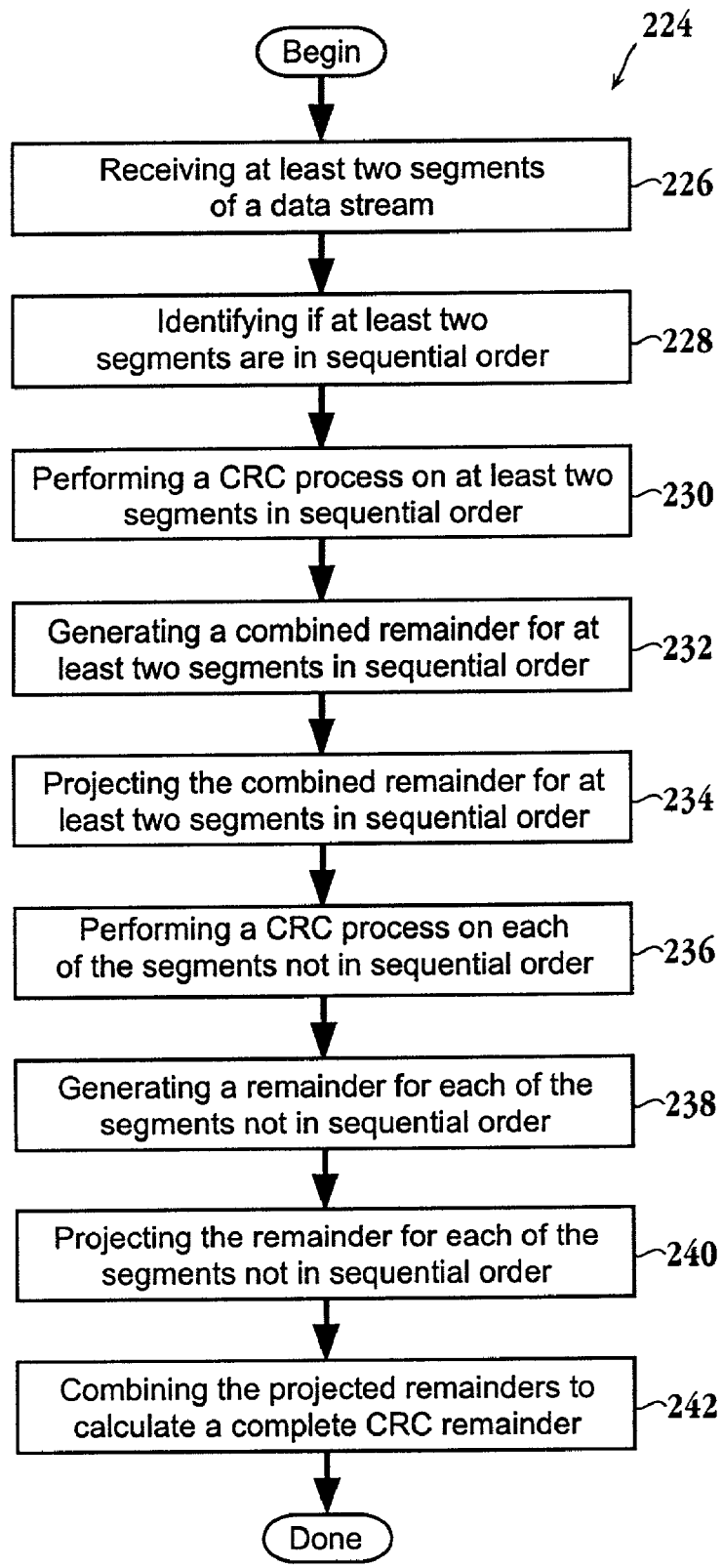
FIG. 12 is a flowchart diagram of a method for performing a cyclic redundancy check (CRC) for a transmitted data stream having at least two segments in sequential order and at least one segment not in a sequential order in accordance with one embodiment of the invention.

FIG. 12 is a flowchart diagram of the method operations for performing a cyclic redundancy check (CRC) for a transmitted data stream having at least two segments in sequential order and at least one segment not in a sequential order in accordance with one embodiment of the invention. Flowchart diagram 224 initiates with operation 226 where at least two segments of a data stream are received. With reference to FIG. 7, the segments are received with some of the segments being in sequential order and some of the segments being received not in sequential order. The method then moves to operation 228 where the at least two segments in sequential order are identified. Referring back to the example of FIG. 7, it can be seen that packets 1–3 are received in sequential order and thus would be identified as such. One skilled in the art would appreciate that the determination of sequential order can be ascertained through data contained in the packet header in one embodiment. The method then advances to operation 230 where a CRC process is performed on the at least two segments in sequential order. Referring to FIG. 8, a conventional CRC process is performed on packets 1–3, which are received in sequential order. The method then proceeds to operation 232 where a combined remainder for the at least two segments in sequential order is generated. For example, with reference again to FIG. 8, the combined reminder for packet 1–3 is determined and appended to the end of packet 3 in one embodiment. The method then moves to operation 234 where the combined remainder for the at least two segments in sequential order is projected. It should be appreciated that the mathematical relationships described above allow for the projection of the combined remainder of operation 234.

Still referring to FIG. 12, the method advances to operation 236 where a CRC process is performed on each of the segments not in sequential order. With reference to FIG. 8, the CRC process is performed on packets 6, 4 and 5 which are the packets received in a non-sequential order. The CRC process generates a remainder for each of the packets not in sequential order in operation 238. The method proceeds to operation 240 where the remainder for each of the segments not in sequential order is projected. Here, the remainder generated in operation 238 is projected to the end of the PDU as described with reference to FIGS. 5 and 8 in one embodiment. One skilled in the art will appreciate that once a segment is received, the CRC process and the projection of the remainder is performed immediately, irrespective of whether or not additional segments are to be received, in one embodiment. The method then moves to operation 242 where the projected remainders are combined to calculate a complete CRC remainder. In one embodiment, the projected remainders are combined through a bit-wise exclusive-OR operation. Once the complete CRC remainder is computed, it will be inverted and compared to the CRC remainder from the transmitting device to determine if any errors occurred during transmission.

Each of the above described methods, or partial methods can be defined as program instructions, commonly defined as software. The software implementation can be either partial or entirely defined in software (e.g., in the form of a software driver), which requires a processor and memory to execute each instruction. Alternatively, part or all of the software code can be defined as micro code or firmware, which can be programmed into a chip. The chip, can either be in the form of silicon (i.e., a semiconductor device), or at least partially in the form of a bioinformatics chip or device.

In still another embodiment, the functions and operations described above can be defined into a semiconductor device. A typical semiconductor device will have sufficient logic (e.g., using transistor device logic gates) to carry out the functions and operations. In specific implementations, the semiconductor device may have on-chip memory, or can be interfaced with other semiconductor chips, printed circuit board circuits, and the like.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for computing a cyclic redundancy check (CRC) for a transmitted data stream, the method comprising:
    performing a CRC process on a first segment of the data stream, the CRC process generating a first CRC remainder;
    projecting the first CRC remainder for the first segment based upon header information of the first segment;
    performing the CRC process on a second segment of the data stream, the CRC process generating a second CRC remainder, the second segment non-contiguous with the first segment;
    projecting the second CRC remainder for the second segment; and
    combining the projected first CRC remainder and the projected second CRC remainder to calculate a complete CRC remainder for the data stream.

2. The method of claim 1, wherein projecting the first CRC remainder further includes:
    calculating a distance between the first segment and an end of the transmitted data stream according to the header information of the first segment.

3. The method of claim 1 further including:
    inverting the complete CRC remainder; and
    comparing the inverted complete CRC remainder to a transmitted CRC remainder to determine if any errors occurred during transmission.

4. The method of claim 1, wherein the transmitted data stream is associated with one of an Internet Small Computer System Interface (iSCSI) protocol or a fibre channel over Internet protocol (FC/IP).

5. The method of claim 1, wherein combining the projected remainders further includes:
    performing a bit-wise exclusive-OR operation.

6. A method for performing a cyclic redundancy check (CRC) for a transmitted data stream having at least two segments, each of the at least two segments having headers attached thereto, the method comprising:
    receiving the data stream;
    identifying whether the at least two segments are in sequential order;
    for each of the at least two segments in sequential order, performing a CRC process on the at least two segments in sequential order, the CRC process generating a combined remainder for the at least two segments in sequential order;
    projecting the combined remainder for the at least two segments in sequential order based upon header information of the at least two segments;
    for each of the segments not in sequential order, performing the CRC process on each of the segments not in sequential order, the CRC process generating a remainder for each of the segments not in sequential order;
    projecting the remainder for each of the segments not in sequential order based upon header information of each of the segments not in sequential order; and
    combining the projected combined remainder for the at least two segments in sequential order and the projected remainders for each of the segments not in sequential order to calculate a complete CRC remainder for the data stream.

7. The method of claim 6, wherein combining the projected remainders further includes:
    performing a bit-wise exclusive-OR operation.

8. The method of claim 7, wherein identifying whether the at least two segments are in sequential order further includes:
    detecting a transmission control protocol (TCP) sequence number from an iSCSI header.

9. The method of claim 6, wherein projecting a combined remainder for the at least two segments in sequential order further includes:
    determining a distance from a last segment in sequential order to an end of the transmitted data stream header information of the last segment.

10. The method of claim 6, wherein the transmitted data stream is associated with an Internet Small Computer System Interface (iSCSI).

11. A method for computing a cyclic redundancy check (CRC) for a transmitted data stream, the method comprising:
    performing a CRC process on a first segment of the data stream, the CRC process generating a first CRC remainder;

projecting the first CRC remainder for the first segment based upon header information of the first segment;

performing the CRC process on a second segment of the data stream, the CRC process generating a second CRC remainder;

projecting the second CRC remainder for the second segment based upon header information of the second segment; and performing a bit-wise exclusive-OR operation to combine the projected first CRC remainder and the projected second CRC remainder to calculate a complete CRC remainder for the data stream.

12. The method of claim 11, wherein the bit-wise exclusive-OR operation is performed by logic gates arranged in a circuit.

13. The method of claim 11 further including:
inverting the complete CRC remainder; and
determining if any errors occurred during transmission.

14. The method of claim 11, wherein the first and second segments are non-contiguous packets of an Internet Small Computer System Interface (iSCSI) protocol.

15. The method of claim 11, wherein projecting the first CRC remainders further includes:
calculating a distance between the first segment of the data stream and an end of the transmitted data stream.

16. A computer readable media having program instructions for computing a cyclic redundancy check (CRC) for a transmitted data stream, comprising:
program instructions for performing a CRC process on a first segment of the data stream, the CRC process generating a first CRC remainder;
program instructions for projecting the first CRC remainder for the first segment based upon header information of the first segment;
program instructions for performing the CRC process on a second segment of the data stream thereby generating a second CRC remainder, the second segment non-contiguous with the first segment;
program instructions for projecting the second CRC remainder for the second segment based upon header information of the first segment; and
program instructions for combining the projected first CRC remainder and the projected second CRC remainder to calculate a complete CRC remainder for the data stream.

17. The computer readable media of claim 16, wherein the program instructions for projecting the second CRC remainder further includes:
program instructions for calculating a distance between the second segment and an end of the transmitted data stream according to the header information of the second segment.

18. A communication chip adapted to receive a data stream transmitted in segments and perform a cyclic redundancy check (CRC) on the segments of the data stream without having received an entirety of the data stream, the communication chip comprising:
a physical layer configured to communicate with a transmitting device over a network;
a receiving section configured to receive the segments of the data stream;
a processing section, the processing section including;
circuitry for performing a CRC process on a first segment of the data stream, the CRC process generating a first CRC remainder;
circuitry for projecting the first CRC remainder for the first segment based upon header information from the first segment;
circuitry for performing the CRC process on a non-contiguous second segment of the data stream, the CRC process generating a second CRC remainder;
circuitry for projecting the second CRC remainder for the second segment based upon header information from the second segment; and
circuitry for combining the projected first CRC remainder and the projected second CRC remainder to calculate a complete CRC remainder for the data stream.

19. The communication chip of claim 18, wherein the circuitry for projecting the first and second CRC remainders calculates a distance between the first segment and the end of the data stream and the second segment and the end of the data stream, respectively.

20. The communication chip of claim 18, wherein the circuitry for combining the projected remainders includes logic gates configured to perform bit-wise exclusive-OR operations.

* * * * *